(12) United States Patent
Coyez et al.

(10) Patent No.: US 9,616,489 B2
(45) Date of Patent: Apr. 11, 2017

(54) CASTING PATTERN

(71) Applicant: SNECMA, Paris (FR)

(72) Inventors: Dominique Coyez, Conflans Sainte Honorine (FR); Serge Fargeas, Sacey (FR)

(73) Assignee: SNECMA, Paris (FR)

( * ) Notice: Subject to any disclaimer, the term of this patent is extended or adjusted under 35 U.S.C. 154(b) by 225 days.

(21) Appl. No.: 14/427,485

(22) PCT Filed: Sep. 6, 2013

(86) PCT No.: PCT/FR2013/052064
§ 371 (c)(1),
(2) Date: Mar. 11, 2015

(87) PCT Pub. No.: WO2014/041288
PCT Pub. Date: Mar. 20, 2014

(65) Prior Publication Data
US 2015/0224567 A1  Aug. 13, 2015

(30) Foreign Application Priority Data

Sep. 11, 2012  (FR) ..................... 12 58526

(51) Int. Cl.
*B22C 7/02* (2006.01)
*B22C 9/04* (2006.01)
*B22D 27/04* (2006.01)
*C30B 11/00* (2006.01)
*C30B 29/52* (2006.01)
(Continued)

(52) U.S. Cl.
CPC .................. *B22C 7/02* (2013.01); *B22C 9/04* (2013.01); *B22C 9/22* (2013.01); *B22D 27/045* (2013.01); *B22D 29/00* (2013.01); *C30B 11/002* (2013.01); *C30B 29/52* (2013.01)

(58) Field of Classification Search
CPC .... B22C 7/02; B22C 9/04; B22C 9/22; B22D 27/045; B22D 29/00
See application file for complete search history.

(56) References Cited

U.S. PATENT DOCUMENTS 3,411,563 A    11/1968   Fleck

FOREIGN PATENT DOCUMENTS

DE    100 33 688 A1    1/2002

OTHER PUBLICATIONS

International Search Report issued Mar. 20, 2014 in PCT/FR2013/052064 Filed Sep. 6, 2013.

*Primary Examiner* — Kevin P Kerns
*Assistant Examiner* — Steven Ha
(74) *Attorney, Agent, or Firm* — Oblon, McClelland, Maier & Neustadt, L.L.P.

(57) ABSTRACT

A casting pattern for a lost-pattern casting, the pattern being in a shape of a turbine engine blade with a root and a body on either side of a platform that is substantially perpendicular to a main axis of the blade, and a method of producing a shell mold from the pattern, and a casting method using the shell mold. The blade body presents a pressure side, a suction side, a leading edge, and a trailing edge. The pattern also includes an expansion strip adjacent to the trailing edge, and a refractory core embedded in the pattern but presenting, both on the pressure side and on the suction side, a respective flush varnished surface between the trailing edge and the expansion strip. A web extends between the platform and the expansion strip and presents a free edge between them.

11 Claims, 5 Drawing Sheets

(51) Int. Cl.
*B22C 9/22* (2006.01)
*B22D 29/00* (2006.01)

CASTING PATTERN

BACKGROUND OF THE INVENTION

The present invention relates to the field of casting, and more particularly to a pattern for lost-pattern casting, and also to methods of fabricating shell molds, and to methods of casting using such a pattern.

So-called "lost-wax" or "lost-pattern" casting methods have been known since antiquity. They are particularly suitable for producing metal parts that are complex in shape. Thus, lost-pattern casting is used in particular for producing turbine engine blades.

In lost-pattern casting, the first step normally comprises making a pattern out of a material having a melting temperature that is comparatively low, such as for example out of wax or resin, and then overmolding the mold onto the pattern. After removing the material of the pattern from the inside of the mold, whence the name of such methods, molten metal is cast into the mold in order to fill the cavity that the pattern has formed inside the mold by being removed therefrom. Once the metal has cooled and solidified, the mold may be opened or destroyed in order to recover a metal part having the shape of the pattern. In the present context, the term "metal" should be understood to cover not only pure metals but also, and above all, metal alloys.

In order to be able to make a plurality of parts simultaneously, it is possible to unite a plurality of patterns in a single assembly in which they are connected together by a tree that forms casting channels in the mold for the molten metal.

Among the various types of mold that can be used in lost-pattern casting, so-called "shell" molds are known that are formed by dipping the pattern or the assembly of patterns into a slip, and then dusting refractory sand onto the pattern or the assembly of patterns coated in the slip in order to form a shell around the pattern or the assembly, and then baking the shell in order to solidify the slip and thus consolidate the slip and the sand. Several successive operations of dipping and dusting may be envisaged in order to obtain a shell of sufficient thickness prior to baking it. The term "refractory sand" is used in the present context to designate any granular material of grain size that is sufficiently small to satisfy the desired production tolerances, that is capable, while in the solid state, of withstanding the temperature of the molten metal, and that is capable of being consolidated into a single solid piece by the slip during baking of the shell.

In order to obtain particularly advantageous thermomechanical properties in the part produced by casting, it may be desirable to ensure that the metal undergoes directional solidification in the mold. The term "directional solidification" is used in the present context to mean that control is exerted over the nucleation and the growth of solid crystals in the molten metal as it passes from the liquid state to the solid state. The purpose of such directional solidification is to avoid the negative effects of grain boundaries within the part. Thus, the directional solidification may be columnar or monocrystalline. Columnar directional solidification consists in orienting all of the grain boundaries in the same direction so that they cannot contribute to propagating cracks. Monocrystalline directivity solidification consists in ensuring that the part solidifies as a single crystal, so as to eliminate all grain boundaries.

Directional solidification is particularly desirable when producing parts that are to be subjected to high levels of thermomechanical stress, such as turbine engine blades. Nevertheless, the complex shapes of such blades can interfere with directional solidification, giving rise to unwanted grains, in particular in the proximity of sharp corners in the blade. In particular, in a turbine engine blade with a root and a body on either side of a platform extending substantially perpendicularly to a main axis of the blade, said body presenting a pressure side, a suction side, a leading edge, and a trailing edge, the sudden transition between the body of the blade and the platform can cause such unwanted grains to form, in particular in the vicinity of the trailing edge.

In order to reduce the weight of turbine engine blades, and above all in order to enable them to be cooled, it is common practice to embed refractory cores in the non-permanent pattern. Such a refractory core remains inside the shell mold after the material of the pattern has been removed, and after the metal has been cast and allowed to cool, thereby forming a hollow volume in the metal part. In particular, in order to provide good cooling of the trailing edge, given that its small thickness makes it particularly vulnerable to high temperatures, it is common practice for such a core to be flush with the surface of the pattern at the trailing edge so as to form a cooling slot for the trailing edge. Nevertheless, the small thickness of the core in this location makes it fragile. In addition, in order to keep the core in the correct position inside the shell mold during casting and cooling of the metal, it is desirable to guide its thermal expansion. For this purpose, the pattern may include a guide strip adjacent to the trailing edge and having a varnished surface of the refractory core flush with each side of the pattern between the trailing edge and the expansion strip. The varnish on these surfaces, which may be removed from the shell mold together with the material of the pattern, ensures that there is a small amount of clearance (of the order of a few hundredths of a millimeter) between the refractory core and the shell mold, so as to guide the expansion of the core at this location in a direction perpendicular to its thickness. Inside the expansion strip, the core can be of greater thickness, thereby making it more robust.

Nevertheless, the complexity between the shape of the mold cavity at the intersections of the trailing edge or the expansion strip with the blade platform significantly increases the risk of grains being generated.

OBJECT AND SUMMARY OF THE INVENTION

The present invention seeks in particular to remedy these drawbacks. In particular, the invention seeks to provide a pattern that makes it possible to avoid unwanted grains forming in the proximity of intersections between the trailing edge or the expansion strip with the platform of a turbine engine blade as produced from the pattern in a lost-pattern casting method.

In at least one embodiment of the present invention, this object is achieved by the fact that the pattern also includes a web extending between the platform and said expansion strip and presenting a free edge between them. The term "web" is used in the present context to designate a wall that is very fine, i.e. of thickness that is substantially less than its other dimensions. The thickness of the web is nevertheless not necessarily less than the thickness of the expansion strip.

By means of these provisions, it is possible to ensure a transition between the trailing edge and the platform that is more gradual, avoiding sharp corners that might be at the origin of unwanted grains. Since the raw casting that results from the casting method using such a pattern must in any event be machined subsequently in order to eliminate the expansion strip, this web can be eliminated in the same machining step without giving rise to additional operations.

Advantageously, the free edge of the web may extend from one edge of the platform to the expansion strip, so as to avoid unwanted grains nucleating not only between the platform and the trailing edge, but also at the edge of the platform.

For better avoidance of unwanted grains forming, the pattern may present a progressive transition between a free edge of the expansion strip and the free edge of the web. In addition, the web may be of thickness that is less than or equal to a thickness of the expansion strip, and the free edge of the web may be rounded in a transverse plane.

The pattern may also include an out-of-part segment extending the body from an end remote from the blade root, in particular in order to provide a smooth transition between a selector channel and the body of the blade. Under such circumstances, the web may present height that is no greater than half the height of the body together with the out-of-part segment.

In order to limit the number of corners that might generate unwanted grains, a junction between the web and the platform may extend a junction between the pressure side and the platform.

In order to facilitate directional solidification, this casting pattern may also have a selector channel pattern that is connected to an end of the blade body that is opposite from the blade root. In a casting method using a mold formed around this casting pattern, it is possible, by progressively cooling the molten metal inside the mold from a starter cavity connected to the blade-shaped cavity via a selector channel, e.g. a baffle-shaped channel, to ensure that only one of the grains that has nucleated in the starter cavity propagates into the blade-shaping cavity.

The invention also provides an assembly comprising a plurality of said casting patterns connected together by a tree so as to be capable of producing a plurality of blades simultaneously.

The invention also provides a method of fabricating a shell mold, the method comprising the steps of dipping at least one such casting pattern in a slip, powdering the at least one slip-coated pattern with refractory sand in order to form a shell around at least one pattern, removing the at least one pattern, and baking the shell. In addition, the invention also provides a casting method in which such fabrication of a shell mold is followed by casting molten metal into the shell mold, cooling the metal with directional solidification thereof, knocking out in order to recover the raw metal casting, and finishing the raw casting. This finishing step may in particular include machining away the out-of-part elements from the raw casting.

BRIEF DESCRIPTION OF THE DRAWINGS

The invention can be well understood and its advantages appear better on reading the following detailed description of an embodiment given by way of non-limiting example. The description refers to the accompanying drawings, in which.

DETAILED DESCRIPTION OF THE INVENTION

Figure 1:
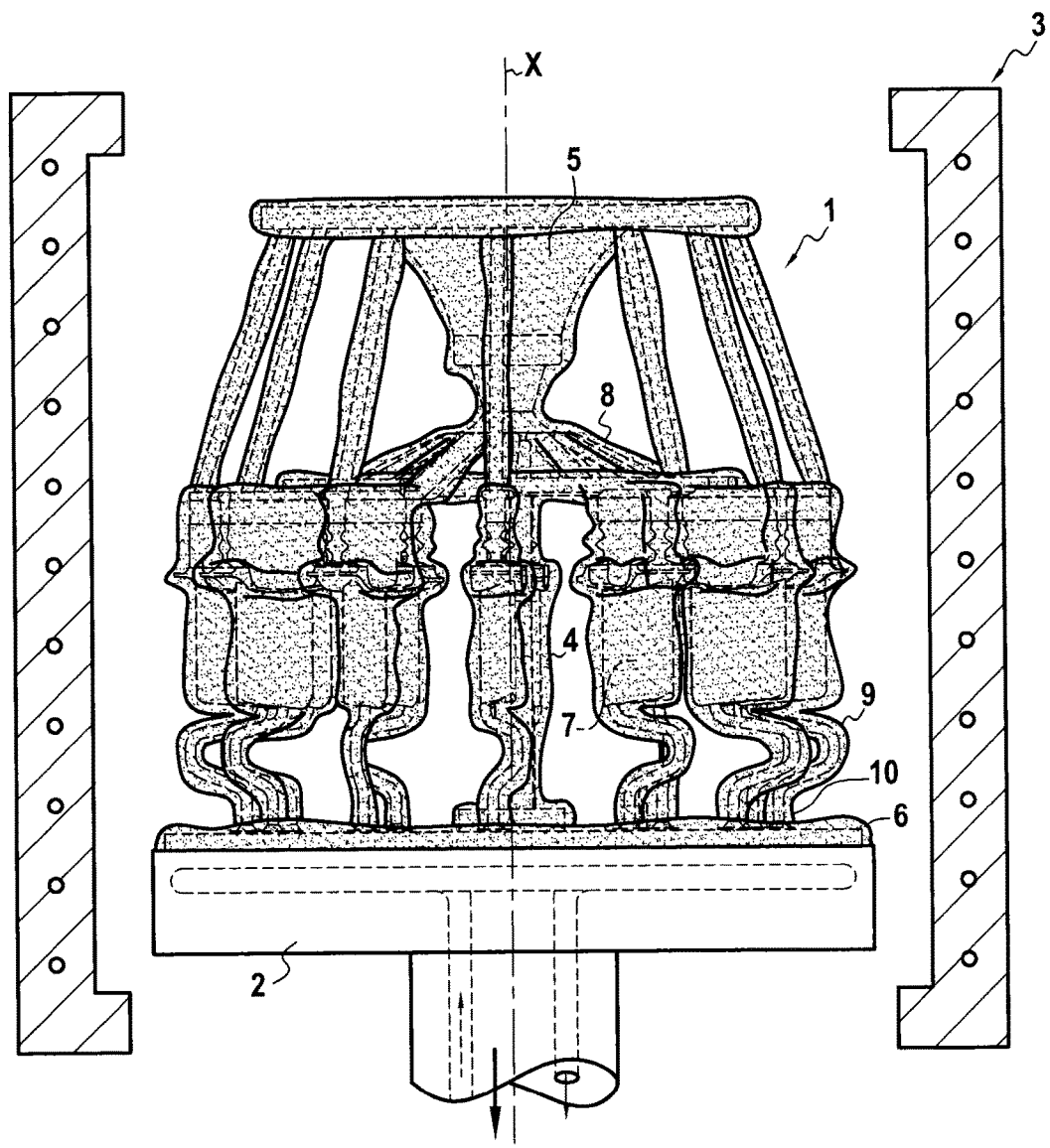
FIG. 1 is a diagram showing the implementation of a directional solidification casting method.

FIG. 1 shows how progressive cooling of the molten metal in order to obtain directional solidification can typically be performed in a casting method.

The shell mold 1 used in this method comprises a central descender 4 extending along the main axis X between a casting cup 5 and a plate-shaped base 6. While the shell mold 1 is being extracted from the heater chamber 3, the base 6 is directly in contact with a soleplate 2. The shell mold 1 also has a plurality of molding cavities 7 arranged as an assembly around the central descender 4. Each molding cavity 7 is connected to the casting cup 5 by a feed channel 8 through which the molten metal is inserted while it is being cast. Each molding cavity 7 is also connected at the bottom via a baffle-selector channel 9 to a starter 10 formed by a smaller cavity adjacent to the base 6.

Figure 2:
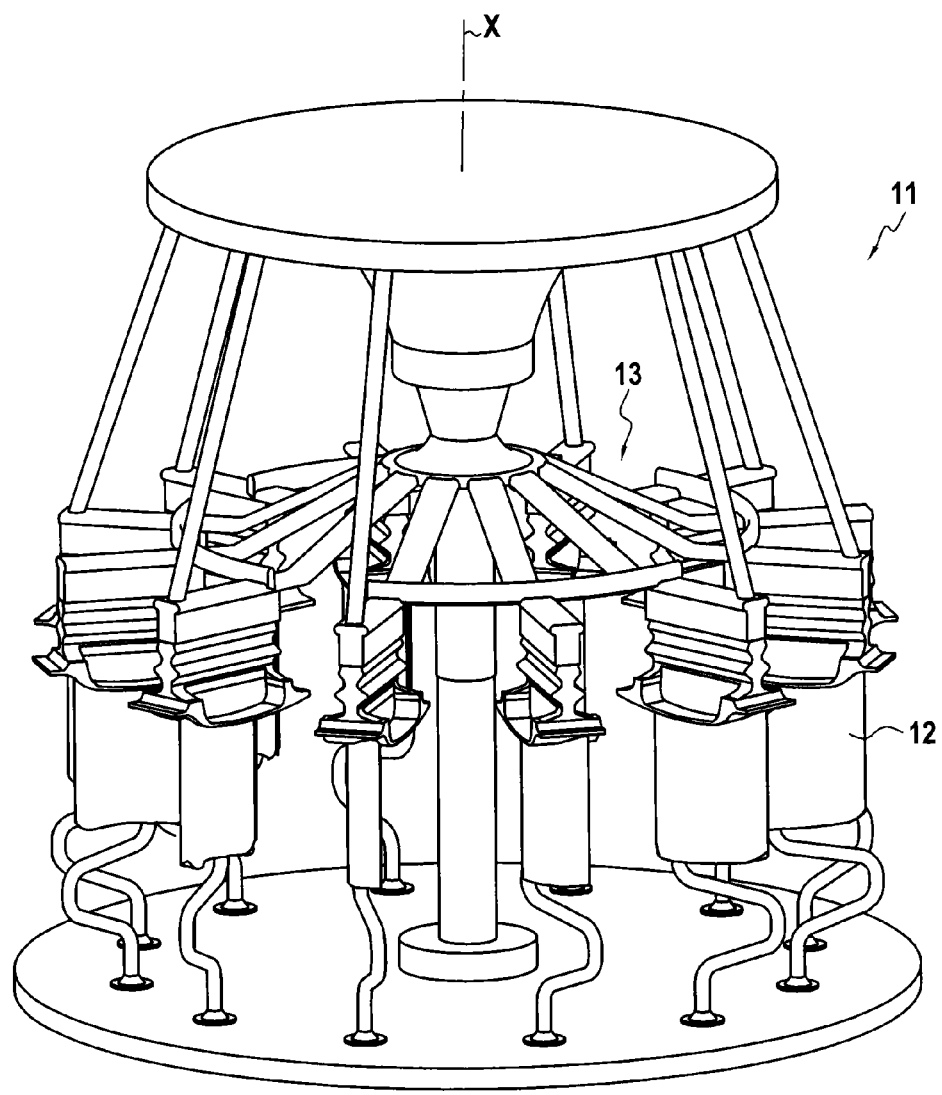
FIG. 2 is a diagram showing an assembly of casting patterns.

The shell mold 1 may be produced by the so-called "lost-wax" or "lost-pattern" method. A first step of such a method is creating a non-permanent assembly 11 comprising a plurality of patterns 12 connected together by a tree 13, as shown in FIG. 2. Both the patterns 12 and the tree 13 are for forming hollow volumes in the shell mold 1 and so they are made of a material having a low melting temperature, such as a patterning resin or wax. When it is intended to produce large numbers of parts, it is possible in particular to produce these elements by injecting the patterning resin or wax into a permanent mold.

In this implementation, in order to produce the shell mold 1 from the non-permanent assembly 11, the assembly 11 is dipped in a slip, and then dusted with refractory sand. These dipping and dusting steps may be repeated several times, until a shell of slip-impregnated sand of desired thickness has been formed around the assembly 11.

The assembly 11 covered in this shell can then be heated so as to melt the low melting-temperature material of the assembly 11 and remove it from the inside of the shell. Thereafter, in a higher temperature baking step, the slip is solidified so as to consolidate the refractory sand and form the shell mold 1.

The metal or metal alloy used in this casting method is cast while molten into the shell mold 1 via the casting cup 5, and it fills the molding cavities via the feed channels 8. During this casting, the shell mold 1 is kept in a heater chamber 3, as shown in FIG. 1. Thereafter, in order to cause the molten metal to cool progressively, the shell mold 1 supported by a cooled and movable support 2 is extracted from the heater chamber 3 downwards along the main axis X. Since the shell mold 1 is cooled via its base 6 by the support 2, the solidification of the molten metal is triggered in the starters 10 and it propagates upwards during the progressive downward extraction of the shell mold 1 from the heater chamber 3. The constriction formed by each selector 9, and also its baffle shape, nevertheless serve to ensure that only one of the grains that nucleates initially in each of the starters 10 is capable of continuing so as to extend to the corresponding mold cavity 7.

Among the metal alloys that are suitable for use in this method, there are to be found in particular monocrystalline nickel alloys such as in particular AM1 and AM3 from Snecma, and also other alloys such as CMSX-2®, CMSX-4®, CMSX-6®, and CMSX-10® from C-M Group, Rene® N5 and N6 from General Electric, RR2000 and SRR99 from Rolls-Royce, and PWA 1480, 1484, and 1487 from Pratt & Whitney, amongst others. Table 1 summarizes the compositions of these alloys:

TABLE 1

Monocrystalline nickel alloys in weight percentages

| Alloy    | Cr   | Co   | Mo   | W    | Al   | Ti   | Ta   | Nb  | Re  | Hf   | C    | B     | Ni  |
|----------|------|------|------|------|------|------|------|-----|-----|------|------|-------|-----|
| CMSX-2   | 8.0  | 5.0  | 0.6  | 8.0  | 5.6  | 1.0  | 6.0  | —   | —   | —    | —    | —     | Bal |
| CMSX-4   | 6.5  | 9.6  | 0.6  | 6.4  | 5.6  | 1.0  | 6.5  | —   | 3.0 | 0.1  | —    | —     | Bal |
| CMSX-6   | 10.0 | 5.0  | 3.0  | —    | 4.8  | 4.7  | 6.0  | —   | —   | 0.1  | —    | —     | Bal |
| CMSX-10  | 2.0  | 3.0  | 0.4  | 5.0  | 5.7  | 0.2  | 8.0  | —   | 6.0 | 0.03 | —    | —     | Bal |
| René N5  | 7.0  | 8.0  | 2.0  | 5.0  | 6.2  | —    | 7.0  | —   | 3.0 | 0.2  | —    | —     | Bal |
| René N6  | 4.2  | 12.5 | 1.4  | 6.0  | 5.75 | —    | 7.2  | —   | 5.4 | 0.15 | 0.05 | 0.004 | Bal |
| RR2000   | 10.0 | 15.0 | 3.0  | —    | 5.5  | 4.0  | —    | —   | —   | —    | —    | —     | Bal |
| SRR99    | 8.0  | 5.0  | —    | 10.0 | 5.5  | 2.2  | 12.0 | —   | —   | —    | —    | —     | Bal |
| PWA1480  | 10.0 | 5.0  | —    | 4.0  | 5.0  | 1.5  | 12.0 | —   | —   | —    | 0.07 | —     | Bal |
| PWA1484  | 5.0  | 10.0 | 2.0  | 6.0  | 5.6  | —    | 9.0  | —   | 3.0 | 0.1  | —    | —     | Bal |
| PWA1487  | 5.0  | 10.0 | 1.9  | 5.9  | 5.6  | —    | 8.4  | —   | 3.0 | 0.25 | —    | —     | Bal |
| AM1      | 7.0  | 8.0  | 2.0  | 5.0  | 5.0  | 1.8  | 8.0  | 1.0 | —   | —    | —    | —     | Bal |
| AM3      | 8.0  | 5.5  | 2.25 | 5.0  | 6.0  | 2.0  | 3.5  | —   | —   | —    | —    | —     | Bal |

After the metal has cooled and solidified in the shell mold, the mold can be knocked out so as to release the metal parts, which can then be finished by machining and/or surface treatment methods.

Figure 3:
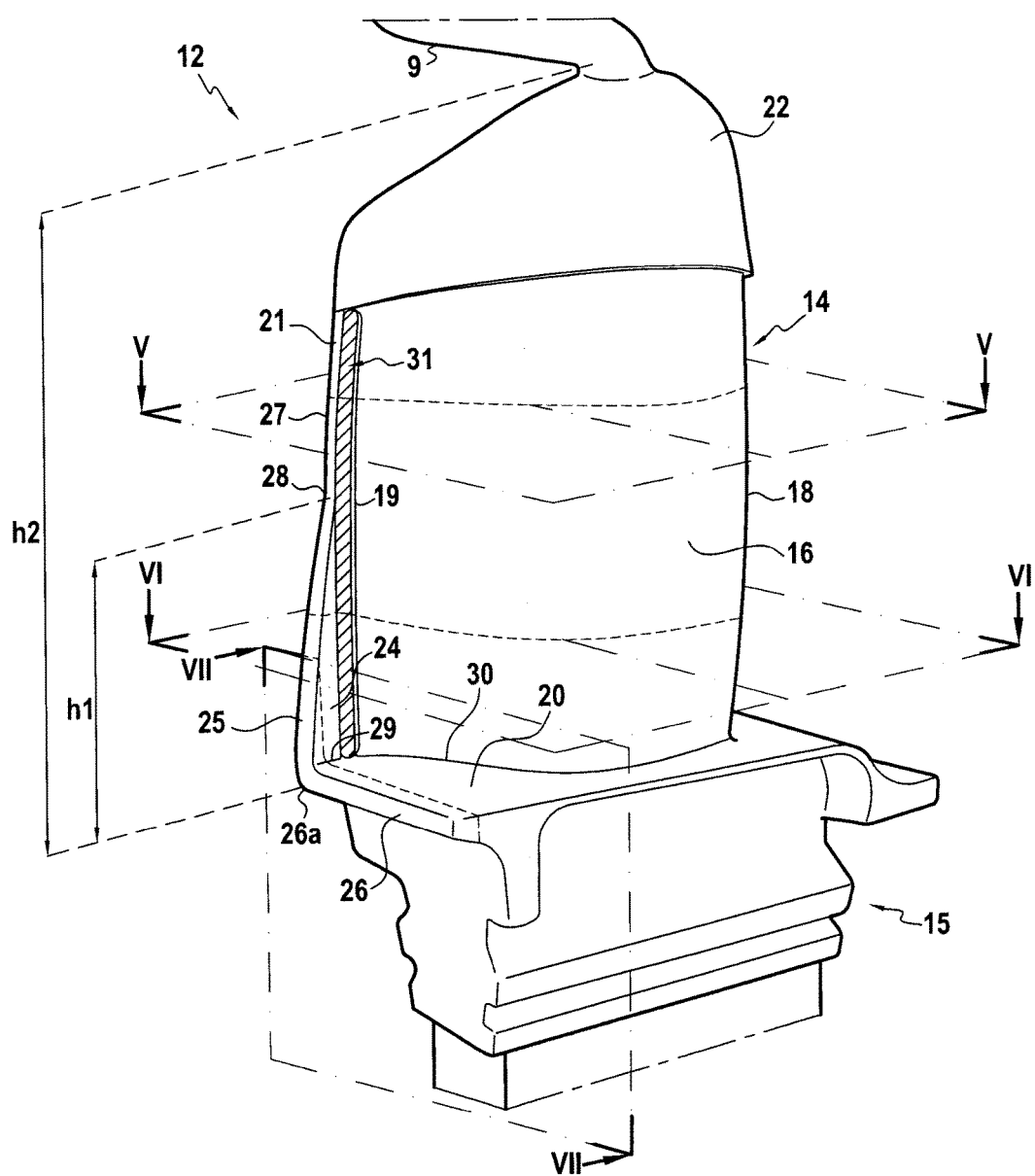
FIG. 3 is a side view of a casting pattern in an embodiment.
Figure 4:
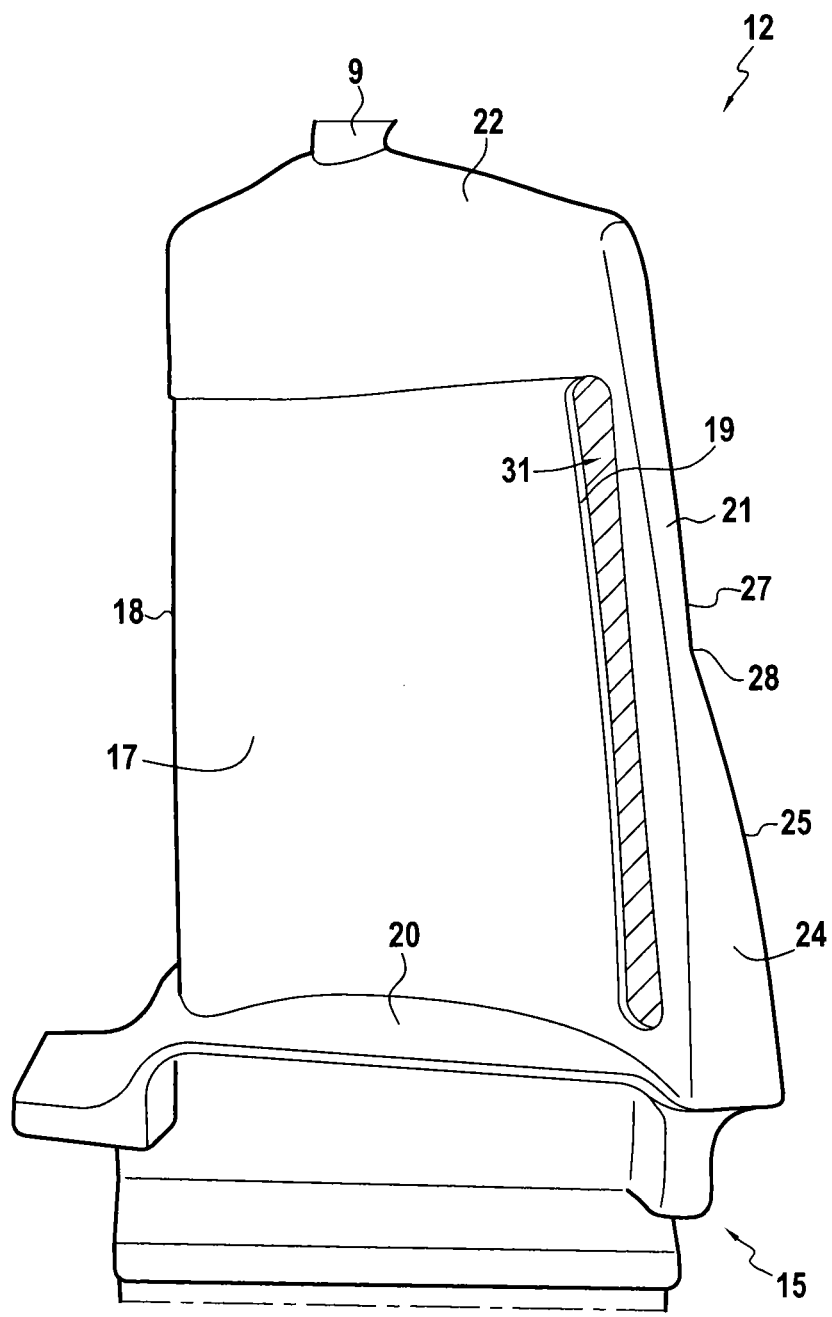
FIG. 4 is a view of an opposite side of the FIG. 3 pattern.

When the parts for molding are of complex shapes, they can nevertheless make the directional solidification of the metal in each mold cavity 7 more complicated. In particular, the sharp corners in the cavity 7 can lead to unwanted grains that weaken the part. In order to avoid such unwanted grains forming, the patterns 12 in this embodiment receive added elements that smooth certain sharp angles in the mold cavities 7. One such casting pattern 12 for producing a turbine engine blade is shown in FIGS. 3 and 4. This casting pattern 12 is thus in the shape of a turbine engine blade with a blade body 14 and a blade root 15 for fastening the blade to a turbine engine rotor. The blade body 14 has a suction side 16 and a pressure side 17 that meet along a leading edge 18 and a trailing edge 19. A platform 20 lies between the blade body 14 and the blade root 15. The pattern 12 also has out-of-part elements, and in particular an expansion strip 21 adjacent to the trailing edge 19 and an out-of-part segment 22 extending the blade body 14 at an end opposite from the blade root 15. This out-of-part segment 22 is for connection to the selector channel 9, and the blade root 15 is for connection to the feed channel 8 so that in the mold cavity 7 formed by the pattern 12 in the shell mold 1, the molten metal flows from the root of the blade 15 towards the blade body 14 during casting, and subsequently solidifies in the opposite direction during its directional solidification.

Figure 5:
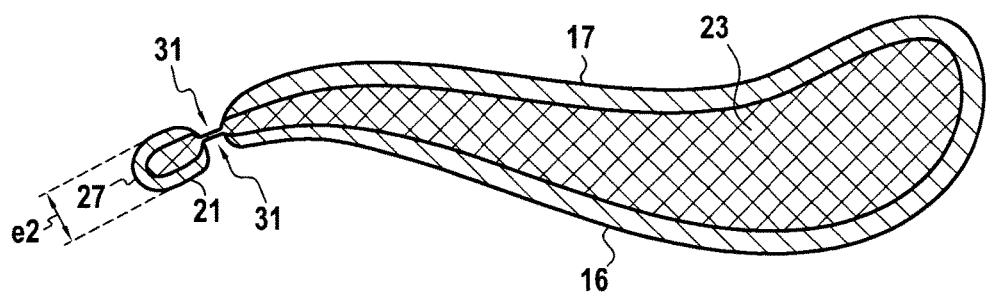
FIG. 5 is a cross-section of the pattern of FIGS. 3 and 4 on line V-V.
Figure 6:
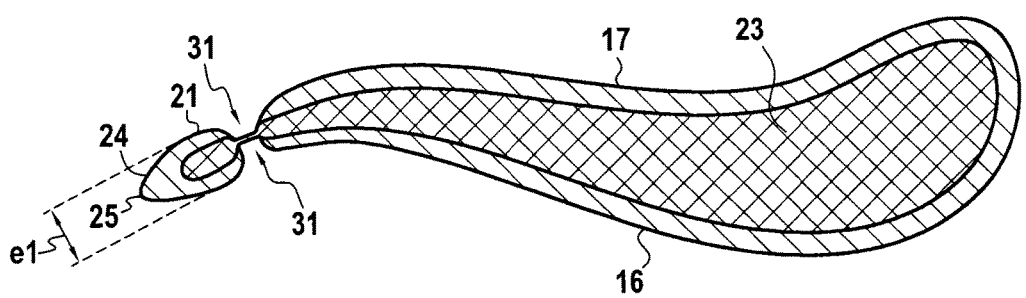
FIG. 6 is a cross-section of the pattern of FIGS. 3 to 5 on line VI-VI.

The pattern 12 also has, a refractory solid core 23 for the purpose of forming a cavity in the turbine engine blade. On each side of the pattern 12, a varnished surface 31 of the core 23 is flush with the surface of the pattern 12 between the trailing edge 19 and the strip 21, as shown in FIGS. 5 and 6. During the steps of dipping and dusting the pattern 12, the slip-impregnated sand shell forms on the exposed surfaces of the pattern 12, including on these varnished surfaces 31 of the core 23. During removal of the pattern and/or baking of the shell, the varnish covering these surfaces 31 is also eliminated, thereby leaving a small amount of clearance, typically lying in the range two to three hundredths of a millimeter, between these surfaces 31 of the core and the corresponding inside surfaces of the shell mold 1. At this location, this small clearance allows the core 23 to move perpendicularly to its thickness relative to the shell mold 1, thereby guiding the thermal expansion of the core 23 during casting and cooling of the metal. Nevertheless, the small size of this clearance prevents the molten metal from running between the core 23 and the shell mold 1 at this location. Thus, in the raw casting, the trailing edge and the strip are separated by a gap that facilitates subsequent machining of the strip while finishing the raw casting.

Figure 7:
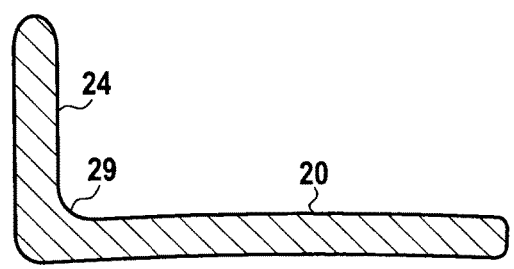
FIG. 7 is a longitudinal section view on line VII-VII of the portion of the pattern shown in FIGS. 3 to 6.

A particularly critical location for the formation of unwanted grains is in the proximity of the intersection between the trailing edge 19 and the platform 20. A plurality of sharp corners can meet at this location, thereby increasing the danger of unwanted grains forming. To avoid that, in the embodiment shown, the pattern 12 also has a fine web 24 between the strip 21 and the platform 20. This web 24 presents a free edge 25 extending between the strip 21 and an end 26a of an edge 26 of the platform 20. The web 24 is of thickness e1 equal to or less than the thickness e2 of the adjacent strip 21. The height h1 of the web 24 is approximately half the raw height h2 of the blade body 14 including the out-of-part segment 22. So long as the free edge 25 of the web 24 and the outside edge 27 of the strip 21 are rounded, as shown in FIGS. 5 and 6, the transition 28 between them is very progressive. The strip 21 and the web 24 both follow the curvature, if any, of the trailing edge 19. The transition 29 between the web 24 and the platform 20 is rounded in the longitudinal plane, as shown in FIG. 7, and runs on from the line of transition 30 between the suction side 17 and the platform 20.

In the casting method used for producing at least one turbine engine blade from such a pattern, the web and the strip in the raw casting can easily be eliminated simultaneously by machining while finishing the raw casting. This makes it possible to obtain a clean part without it being necessary to perform more machining operations than would be required with a pattern that does not have the web 24.

Although the present invention is described with reference to a specific embodiment, it is clear that various modifications and changes may be made thereto without going beyond the general ambit of the invention as defined by the claims. In addition, individual characteristics of the various embodiments mentioned may be combined in additional embodiments. Consequently, the description and the drawings should be considered in an illustrative sense rather than in a restrictive sense.

The invention claimed is:

1. A pattern for lost-pattern casting, the pattern being in a shape of a turbine engine blade with a root and a body on either side of a platform that is substantially perpendicular to a main axis of the blade, the blade body presenting a pressure side, a suction side, a leading edge, and a trailing edge, the pattern comprising:
   an expansion strip adjacent to the trailing edge, and a refractory core embedded in the pattern but presenting, both on the pressure side and on the suction side, a respective flush varnished surface between the trailing edge and the expansion strip; and
   a web extending between the platform and the expansion strip and presenting a free edge between them.

2. The pattern according to claim 1, wherein the free edge of the web extends from one edge of the platform to the expansion strip.

3. The pattern according to claim 1, further presenting a progressive transition between a free edge of the expansion strip and the free edge of the web.

4. The pattern according to claim 1, wherein the web has a thickness that is less than or equal to a thickness of the expansion strip.

5. The pattern according to claim 1, wherein the free edge of the web is rounded in a transverse plane.

6. The pattern according to claim 1, further comprising an out-of-part segment extending the body at an end opposite from the root of the blade, and wherein the web presents a height that is not greater than half the height of the body including the out-of-part segment.

7. The pattern according to claim 1, wherein a junction between the web and the platform extends a junction between the suction side and the platform.

8. The pattern according to claim 1, further comprising a selector channel pattern that is connected to an end of the blade body that is opposite from the blade root.

9. An assembly comprising:
   a plurality of patterns that are connected together by a tree,
   wherein each pattern of the plurality is in a shape of a turbine engine blade with a root and a body on either side of a platform that is substantially perpendicular to a main axis of the blade, the blade body presenting a pressure side, a suction side, a leading edge, and a trailing edge, and
   the pattern comprising an expansion strip adjacent to the trailing edge, a refractory core embedded in the pattern but presenting, both on the pressure side and on the suction side, a respective flush varnished surface between the trailing edge and the expansion strip, and a web extending between the platform and the expansion strip and presenting a free edge between them.

10. A method of fabricating a shell mold, the method comprising:
   dipping in a slip at least one casting pattern in a shape of a turbine engine blade with a root and a body on either side of a platform that is substantially perpendicular to a main axis of the blade, the blade body presenting a pressure side, a suction side, a leading edge, and a trailing edge, the pattern comprising an expansion strip adjacent to the trailing edge, a refractory core embedded in the pattern but presenting, both on the pressure side and on the suction side, a respective flush varnished surface between the trailing edge and the expansion strip, and a web extending between the platform and the expansion strip and presenting a free edge between them;
   powdering the at least one slip-coated pattern with refractory sand to form a shell around the at least one pattern;
   removing the at least one pattern; and
   baking the shell.

11. A casting method comprising:
   dipping in a slip at least one casting pattern in a shape of a turbine engine blade with a root and a body on either side of a platform that is substantially perpendicular to a main axis of the blade, the blade body presenting a pressure side, a suction side, a leading edge, and a trailing edge, the pattern comprising an expansion strip adjacent to the trailing edge, a refractory core embedded in the pattern but presenting, both on the pressure side and on the suction side, a respective flush varnished surface between the trailing edge and the expansion strip, and a web extending between the platform and the expansion strip and presenting a free edge between them;
   powdering the at least one slip-coated pattern with refractory sand to form a shell around the at least one pattern;
   removing the at least one pattern;
   baking the shell to fabricate a shell mold;
   casting molten metal into the shell mold;
   cooling the metal with directional solidification thereof;
   knocking out the shell mold to recover a raw metal casting; and
   finishing the raw casting.

* * * * *